(12) United States Patent
Wei (10) Patent No.: US 7,639,766 B2
(45) Date of Patent: Dec. 29, 2009

(54) COMBINED AUTOMATIC FREQUENCY CORRECTION AND TIME TRACK SYSTEM TO MINIMIZE SAMPLE TIMING ERRORS

(75) Inventor: Paul Chun-Hsiung Wei, San Diego, CA (US)

(73) Assignee: VIA Telecom Co., Ltd., San Diego, CA (US)

( * ) Notice: Subject to any disclaimer, the term of this patent is extended or adjusted under 35 U.S.C. 154(b) by 802 days.

(21) Appl. No.: 10/950,702

(22) Filed: Sep. 27, 2004

(65) Prior Publication Data

US 2006/0068745 A1   Mar. 30, 2006

(51) Int. Cl.
*H04L 7/00* (2006.01)
(52) U.S. Cl. .................. 375/355; 375/354; 375/295; 375/298; 375/308; 375/279
(58) Field of Classification Search ............ 375/355, 375/295, 298, 308, 279, 340
See application file for complete search history.

(56) References Cited

U.S. PATENT DOCUMENTS

| 5,812,615 | A * | 9/1998 | Baum et al. ............. 375/344 |
| 5,852,630 | A * | 12/1998 | Langberg et al. .......... 375/219 |
| 6,266,365 | B1 | 7/2001 | Wang et al. .............. 375/150 |
| 6,389,088 | B1 * | 5/2002 | Blois et al. ............... 375/355 |
| 6,463,266 | B1 | 10/2002 | Shohara ................. 455/196.1 |
| 6,560,298 | B1 * | 5/2003 | Froehling et al. ........... 375/344 |
| 6,580,750 | B2 * | 6/2003 | Aue ..................... 375/150 |
| 6,625,434 | B1 * | 9/2003 | Arimitsu et al. .......... 455/259 |
| 6,704,552 | B1 * | 3/2004 | Matsumoto ............. 455/164.1 |
| 6,738,608 | B2 * | 5/2004 | Black et al. .............. 455/260 |
| 6,741,665 | B2 * | 5/2004 | Kenney et al. ............ 375/344 |
| 7,006,840 | B2 * | 2/2006 | Bultan et al. ............. 455/502 |
| 7,065,163 | B2 * | 6/2006 | Rick et al. ............... 375/344 |
| 7,088,955 | B2 * | 8/2006 | Challa et al. ............ 455/63.3 |
| 7,095,993 | B2 * | 8/2006 | You et al. ............... 455/192.2 |
| 7,106,784 | B2 * | 9/2006 | Eltawil et al. ............ 375/148 |
| 7,221,696 | B1 * | 5/2007 | McLeod et al. .......... 375/140 |
| 2002/0006158 | A1 * | 1/2002 | Schmidl et al. .......... 375/150 |
| 2003/0235258 | A1 * | 12/2003 | Kenney et al. ........... 375/344 |
| 2004/0058653 | A1 | 3/2004 | Dent ..................... 455/69 |
| 2004/0081114 | A1 * | 4/2004 | Jiang et al. .............. 370/320 |
| 2005/0002481 | A1 * | 1/2005 | Woo et al. .............. 375/354 |
| 2005/0043825 | A1 * | 2/2005 | Aldridge et al. .......... 700/39 |
| 2005/0281318 | A1 * | 12/2005 | Neugebauer ............. 375/134 |
| 2006/0098767 | A1 * | 5/2006 | Zehavi et al. ............ 375/346 |

* cited by examiner

*Primary Examiner*—Shuwang Liu
*Assistant Examiner*—Kenneth Lam
(74) *Attorney, Agent, or Firm*—Christopher P. Maiorana, PC (57) ABSTRACT

A circuit including an analog to digital converter and a processor is disclosed. The analog to digital converter may be configured to generate a plurality of samples from a received signal in response to a reference signal. The processor may be configured to designate one of an early sample of the samples and a late sample of the samples as an ideal sample in response to a first timing error of an on-time sample of the samples being greater than one-half a sample period of the received signal.

30 Claims, 4 Drawing Sheets

COMBINED AUTOMATIC FREQUENCY CORRECTION AND TIME TRACK SYSTEM TO MINIMIZE SAMPLE TIMING ERRORS

FIELD OF THE INVENTION

The present invention relates to a method and/or architecture for code division multiple access receivers generally and, more particularly, to a combined automatic frequency correction and time track system to minimize sample timing errors.

BACKGROUND OF THE INVENTION

In a conventional code division multiple access (CDMA) receiver, a received signal is first down converted from a carrier frequency to a more suitable baseband. The baseband is subsequently digitally sampled for further processing. The down converting and digitizing obligates the conventional CDMA receiver to achieve both a frequency lock and a timing lock with transmitted signals broadcast from a transmitter. The digital samples are used by the conventional CDMA receiver for recovery of the transmitted signals.

Figure 1:
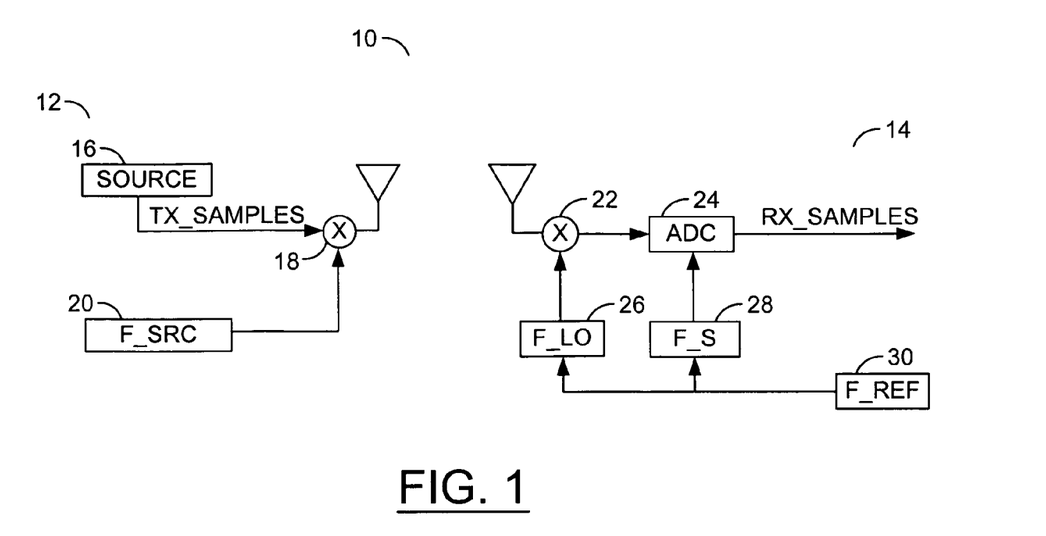
FIG. 1 is a block diagram of a conventional CDMA system.

Referring to FIG. 1, a block diagram of a partial conventional CDMA system 10 is shown. The conventional CDMA system 10 includes a transmitter 12 and a receiver 14. The transmitter 12 has a data source 16, a mixer 18 and a source oscillator 20. The receiver 14 has a mixer 22, an analog to digital converter (ADC) 24, a local oscillator 26, a sampling oscillator 28 and a reference oscillator 30.

Two different processes maintain the receiver 14 in lock with the transmitter 12. A first process is an automatic frequency correction (AFC) process that works to track a frequency of the received signal. A second process is a time tracking process that works to track the timing of the received signal. The conventional CDMA receiver 14 typically generates a reference signal (i.e., F_REF) in the reference oscillator 30 from which all other frequencies are derived, notably a sample clock signal (i.e., F_S) and a local clock signal (i.e., F_LO). The AFC process seeks to adjust the local clock signal F_LO to match a source clock signal (i.e., F_SRC) in the transmitter 12 by adjusting the reference clock signal F_REF. The time tracking process seeks to select and match a received sample (i.e., RX_SAMPLES) with a corresponding transmit sample (i.e., TX_SAMPLES).

Figure 2:
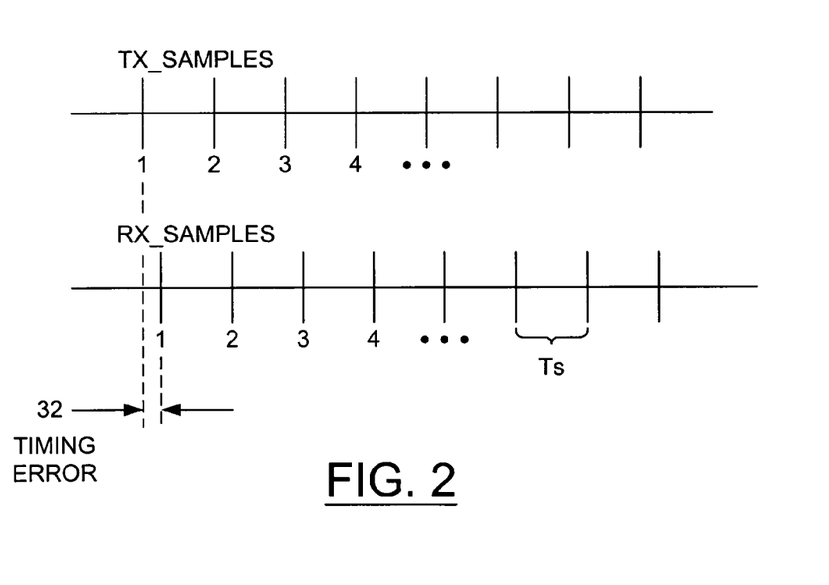
FIG. 2 is a time line diagram illustrating an example timing offset for the conventional CDMA system.

Referring to FIG. 2, a time line diagram illustrating an example timing offset for the conventional CDMA system 10 is shown. In the example timing, the AFC process has locked to the source clock signal F_SRC and a slight timing error 32 exists between the transmitted samples TX_SAMPLES and the received samples RX_SAMPLES. Individual RX_SAMPLES are separated by a sample period (i.e., Ts) Typically, the sample period Ts is chosen such that a maximum sampling error of Ts/2 seconds produces a minimal degradation to the system performance. For the conventional CDMA system 10, the sample period Ts is commonly ⅛th of a CDMA chip duration (i.e., Tc/8).

For most scenarios, the Tc/8 sample spacing produces a negligible timing error of Tc/16. However, in some special cases when an input noise is dominated by cross-correlation from the user's own signal or signals from other users, further reduction in the timing error is desirable. In the conventional CDMA system 10, where the AFC process and time tracking process operate independently, once the AFC process locks (i.e., F_LO=F_SRC), the timing error is fixed. In FIG. 2, the spacing between samples is the same but a fixed offset 32 remains between the edges of the transmitted samples and the received samples. The amount of error is random and may be as large as Ts/2.

U.S. Pat. No. 6,266,365 to Wang et al. discloses a CDMA receiver. Wang discloses, "In order to compensate for errors derived from the lower sampling rate, firstly adjustments are made to the phase of the clock signal for sampling the received signal and secondly a new algorithm is applied to adjust the phase of the clock signal used by each DLL for generating its local spreading waveform. In this context, adjustment of phase means change in the position of the leading edge of the clock waveform. It does not mean change of frequency of that waveform, which can be realized by automatic frequency control (AFC)." Biasing the AFC circuitry would be desirable to reduce the time tracking error.

U.S. Publication 2004/0058653 to Dent discloses a chip rate correction in digital transceivers. Dent discloses, "In one exemplary embodiment of the invention, the timing correction circuit generates a frequency offset value based on the timing error so that the local frequency reference is biased, and hence the CDMA chip rate, is gradually altered to correct the timing drift at the penalty of an alteration in the frequency of transmission." Accounting for timing errors greater than Ts/2 other than through a gradual adjustment would be desirable.

SUMMARY OF THE INVENTION

The present invention concerns a circuit generally comprising an analog to digital converter and a processor. The analog to digital converter may be configured to generate a plurality of samples from a received signal in response to a reference signal. The processor may be configured to designate one of an early sample of the samples and a late sample of the samples as an ideal sample in response to a first timing error of an on-time sample of the samples being greater than one-half a sample period of the received signal.

The objects, features and advantages of the present invention include providing a method and/or circuit for combining automatic frequency correction and time tracking that may (i) minimize sample tracking errors, (ii) allow a zero timing error without increasing a sample rate of an analog to digital converter, (iii) adjust large timing errors by changing a sample used and/or (iv) feed a frequency bias proportional to a timing error into an automatic frequency control process.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention provides a method whereby an automatic frequency correction (AFC) process and a time tracking process may be combined to reduce a timing error within a code division multiple access (CDMA) receiver. In a CDMA sampled receiver system, a sample spacing generally dictates minimum sampling error. Conventionally, AFC and time tracking operate independently such that once the AFC locks, sample edge alignment and spacing are fixed relative to an incoming signal. The time alignment between transmitted samples and received samples may be offset by as much as one-half of the sample spacing or period (e.g., Ts). The present invention combines the time tracking process with the AFC process to minimize sample timing errors. For timing errors greater than half the sample period (e.g., >Ts/2), timing may be rapidly adjusted by changing the received sample used (e.g., ideal sample). For nonzero timing errors less than or equal to one-half the sample period (e.g., <Ts/2), a frequency bias proportional to the timing error may be introduced into the AFC process to minimize or eliminate the timing errors.

Figure 3:
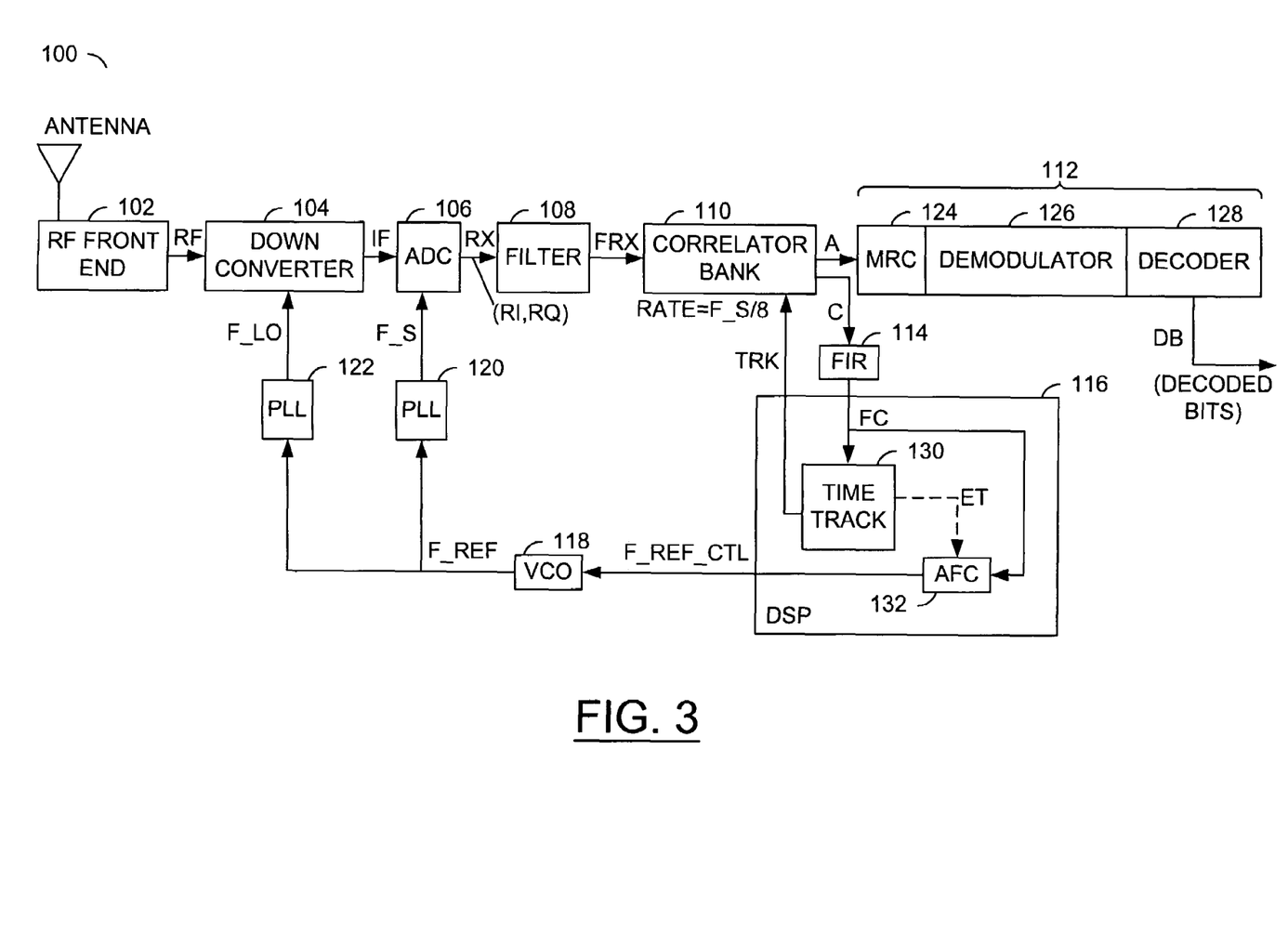
FIG. 3 is a functional block diagram of an example CDMA receiver circuit in accordance with a preferred embodiment of the invention.

Referring to FIG. 3, a functional block diagram of an example CDMA receiver circuit (or system) 100 is shown in accordance with a preferred embodiment of the invention. The CDMA receiver circuit 100 may be referred to as a receiver circuit 100 for short. The receiver circuit 100 generally comprises an RF front end circuit (or module) 102, a down converter circuit (or module) 104, an analog to digital (ADC) converter circuit (or module) 106, a filter circuit (or module) 108, a correlator bank circuit (or module) 110, a detector circuit (or module) 112, a finite impulse response (FIR) filter (or module) 114, a processor circuit (or module) 116, a voltage controlled oscillator (VCO) circuit (or module) 118, a first phase lock loop (PLL) circuit (or module) 120 and a second PLL circuit (or module) 122. The detector circuit 112 may include a maximum ratio combining circuit (or module) 124, a demodulator circuit (or module) 126 and a decoder circuit (or module) 128. The processor circuit 116 may execute software routines for a time tracking process 130 and an automatic frequency correction (AFC) process 132.

The RF front end circuit 102 may amplify antenna signals to produce a radio frequency signal (e.g., RF). The down converter circuit 104 may convert the signal RF to a baseband or intermediate frequency presented as a signal (e.g., IF). The down conversion may be controlled by a local oscillator signal (e.g., F_LO) generated by the PLL 122. The ADC circuit 106 may digitize the signal IF to create samples (e.g., RX). Sample timing may be controlled by a sample clock signal (e.g., F_S) generated by the PLL 120. The filter circuit 108 may filter the samples RX to produce filtered samples (e.g., FRX).

The correlator bank circuit 110 may operate on the filtered samples FRX to generate an output signal (e.g., A) and a correlation signal (e.g., C). The output signal A may be combined, demodulated and decoded by the detector circuit 112 to generate decoded bits (e.g., DB). The correlation signal C may be filtered by the FIR circuit 114 to generate a filtered correlation signal (e.g., FC). The filtered correlation signal FC may be operated on by the processor circuit 116 to generate a tracking signal (e.g., TRK), a reference frequency control (or error) signal (e.g., F_REF_CTL) and a timing error statistic signal (e.g., ET). The tracking signal TRK may be presented back to the correlator bank circuit 110 to adjust individual correlators (see FIG. 4) within the correlator bank circuit 110. The reference frequency control signal F_REF_CTL may be presented to the VCO circuit 118 to control the frequency of a reference clock signal (e.g., F_REF). The PLL 120 may generate the sample clock signal F_S based on the reference clock signal F_REF. The PLL 122 may generate the local oscillator signal F_LO based on the reference clock signal F_REF. The timing error statistic signal ET may be transferred from the time tracking process 130 to the AFC process 132.

Figure 4:
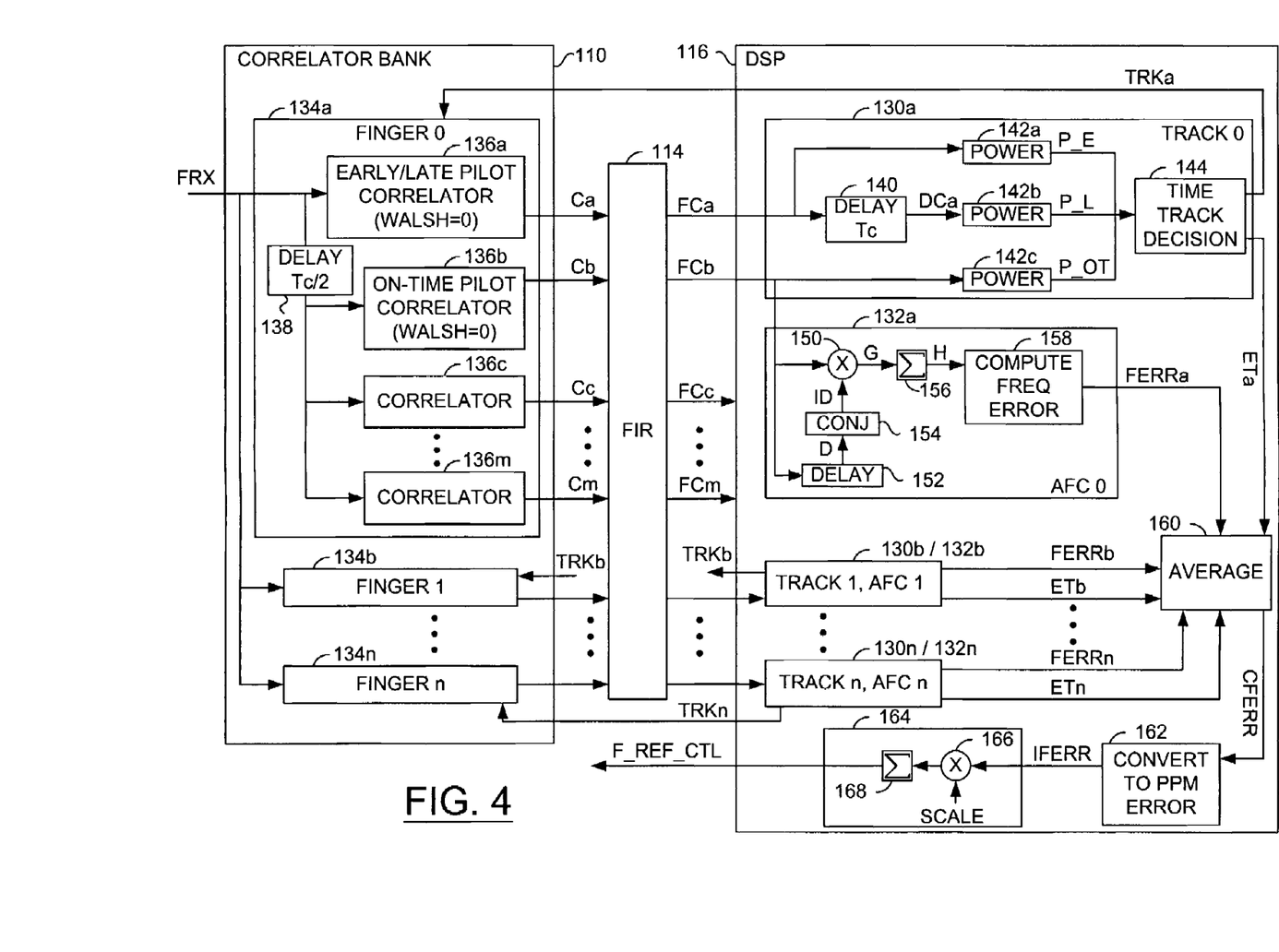
FIG. 4 is a block diagram of an example implementation of a correlator block circuit and a processor circuit.

Referring to FIG. 4, a block diagram of an example implementation of the correlator block circuit 110 and the processor circuit 116 is shown. The correlator bank circuit 110 generally comprises multiple finger circuits (or modules) 134a-134n. Each of the finger circuits 134a-134n may receive the filtered receive samples FRX from the filter circuit 108. An individual finger circuit 134 (e.g., finger circuit 134a) generally comprises multiple correlator circuits (or modules) 136a-136m and at least one delay circuit 138. A first correlator circuit 136a may be referred to as an early/late pilot correlator circuit. A second correlator circuit 136b may be referred to as an on-time pilot correlator circuit. The delay circuit 138 may be operational to delay the filtered sample signal FRX to the on-time pilot correlator circuit 136b and the other correlator circuits 136c-136n. A delay of one-half a chip period (e.g., Tc/2) may be implemented by the delay circuit 138.

Each of the correlator circuits 136a-136m may generate a respective correlation signal (e.g., Ca-Cm) substantially simultaneously. The correlation signals Ca-Cm may be collectively referred to as the correlation signal C (see FIG. 3). The filtered correlation signal FC generally comprises a respective filtered correlation signal (e.g., FCa-FCm) for each of the correlation signals Ca-Cm.

The processor circuit 116 may be implemented as a digital signal processor (DSP) circuit. The DSP circuit 116 may receive the filtered correlation signals FCa-FCm from each of the finger circuits 134a-134n. A time tracking process 130a may operate on the filtered correlator signals FCa-FCb (e.g., early/late values and on-time values) to generate a respective track signal (e.g., TRKa) for the finger circuit 134a. The time tracking process 130a may also operate on the filtered correlator signals FCa-FCb to generate a respective timing error statistic signal (e.g., ETa) for the finger circuit 134a. The time tracking processes 130b-130n may operate on similar signals from the finger circuits 134b-134n. The track signals TRKa-TRKn may be collectively referred to as the track signal TRK (see FIG. 3). The timing error statistic signals ETa-ETn may be collectively referred to as the timing error statistic signal ET.

An AFC process 132a may be operational on the filtered correlation signal FCb (e.g., the on-time values) to generate a respective intermediate error signal (e.g., FERRa) for the finger circuit 134a. The AFC processes 132b-132n may operate on similar signals from the finger circuits 134b-134n. The top-level AFC process 132 may include an averaging process 160 that combines the intermediate error signals FERRa-FERRn to generate a combined filter error signal (e.g., CFERR). The top-level AFC process 132 may include another process 164 to integrate and sum the combined filter error signal CFERR to generate the reference frequency control signal F_REF_CTL.

The time tracking process 130a generally comprises a delay process (or module) 140, multiple power calculation processes (or modules) 142a-142c and a time track decision process (or module) 144. A first power calculation process 142a may operate on the first filtered correlator signal FCa (e.g., early/late) to generate an early power signal (e.g., P_E). The delay process 140 may delay the first filtered correlator signal FCa by a chip period Tc to generate a delayed first correlator signal (e.g., DCa). A second power calculation process 142b may operate on a delayed first filtered correlator signal DCa to generate a late power signal (e.g., P_L). A third power calculation process 142c may operate on the second correlator signal FCb (e.g., on-time) to generate an on-time power signal (e.g., P_OT). The time track decision process 144 may operate on the power signals P_E, P_L and P_OT to generate the first track signal TRKa and a first timing error statistic signal (e.g., ETa).

The AFC process 132a generally comprises a multiplier process (or module) 150, a delay process (or module) 152, a conjugation process (or module) 154, a summation process (or module) 156 and a computation process (or module) 158. The delay process 152 may be operational to generate a delay signal (e.g., D) by delaying the filtered second correlator signal FCb (e.g., on-time). The conjugation process 154 may be operational to perform an element-wise conjugation on the delayed signal D to generate an intermediate signal (e.g., ID). The multiplier process 150 may be operational to multiply the second filtered correlator signal FCb with the intermediate signal ID to generate another intermediate signal (e.g., G). The summation process 156 may generate a signal (e.g., H) by summing values of the intermediate signal G. The computation process 158 may calculate an intermediate frequency error signal (e.g., FERRa) based on the signal H.

An instantiation of the time tracking process 130a and the AFC process 132a may be provided for each finger circuit 134a-134n. The respective intermediate frequency error signals FERRa-FERRn and the respective timing error statistic signals ETa-ETn may be averaged by the averaging process 160 to generate a combined frequency error signal (e.g., CFERR). A conversion process 162 may operate on the combined frequency error signal CFERR to generate an intermediate frequency error signal (e.g., IFERR) that conveys the frequency error in terms of parts per million (ppm). The integration process 164 may operate (e.g., multiply 166) on the intermediate frequency error signal IFERR with a scale factor (e.g., SCALE) and then integrate through a summation process 168 to generate the reference frequency control signal F_REF_CTL. The averaging process 160, the conversion process 162, and the integration process 164 may be considered part of the overall AFC process 132 (see FIG. 3).

Figure 5:
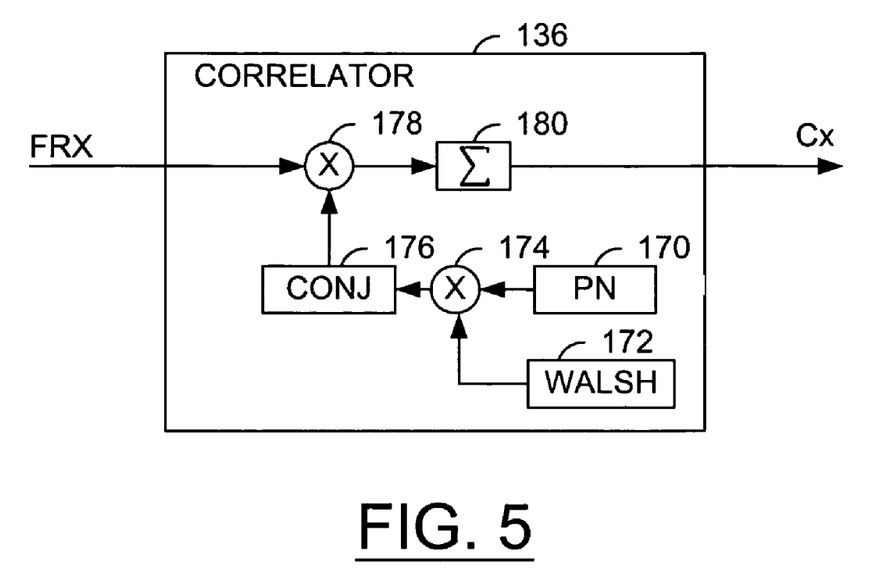
FIG. 5 is a block diagram of an example implementation of a correlator circuit.

Referring to FIG. 5, a block diagram of an example implementation of a correlator circuit 136 (e.g., 136a-136m) is shown. The correlator circuit 136 generally comprises a pseudo-random number (PN) generator circuit (or module) 170, a Walsh sequence generator circuit (or modules) 172, a multiplier circuit (or module) 174, a conjugation circuit (or module) 176, a multiplier circuit (or module) 178 and a summation circuit (or module) 180. The correlator circuit 136 may receive the filtered received sample FRX. The correlator circuit 136 may generate a correlation signal (e.g., Cx). The correlation signal Cx may be any of the correlation signals Ca-Cm.

The multiplier circuit 174 may multiply information received from both the PN generator circuit 170 and the Walsh sequence generator circuit 172. A product of the multiplication (174) may be feed to the conjugation circuit 176. An output of the conjugation circuit 176 may be multiplied with the filtered received sample FRX by the multiplier circuit 178. A product of the multiplication (178) may be received by the summation circuit 180. The summation circuit 180 may generate the correlation signal Cx.

Figure 6:
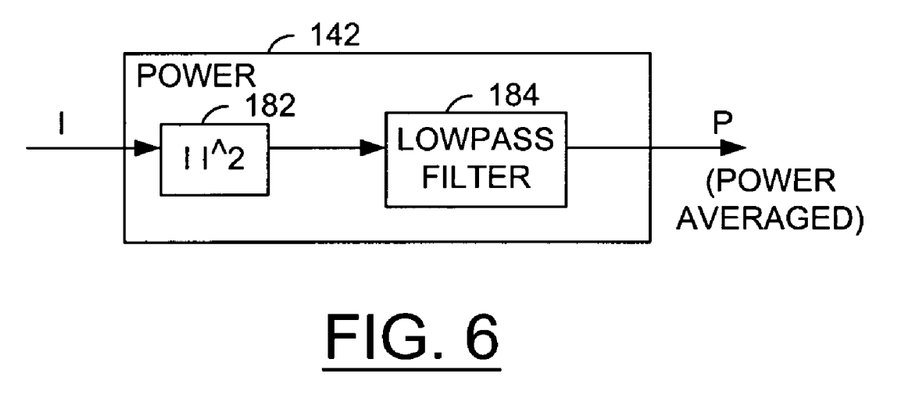
FIG. 6 is a block diagram of an example implementation of a power calculation process.

Referring to FIG. 6, a block diagram of an example implementation of a power calculation process 142 (e.g., 142a-142c) is shown. The power calculation process 142 generally comprises a logical process (or module) 182 and a low pass filter process (or module) 184. The power calculation process 142 may receive a filtered correlation signal (e.g., I). The correlation signal I may received directly from the FIR circuit 114 (e.g., FCa) and/or from the delay process 140 (e.g., DCa). The power calculation process 142 may generate a power signal (e.g., P). The power signal P may be any of the power signals P_L, P_E and/or P_OT.

Operationally, several correlator circuits 136a-136m may be grouped together and referred to as a finger circuit 134 (e.g., 134a-134n). All the correlator circuits 136a-136m in a finger circuit 134 may process signals for a single particular received path. If multiple paths exists, a different finger circuit 134 may be assigned to each of the paths. The number of finger circuits 134 employed depends on a multipath profile. For cellular CDMA systems, there may be four finger circuits 134. Other numbers of finger circuits 134 may be implemented to meet the criteria of a particular application.

The fingers circuits 134 process decimated filtered samples FRX from the ADC circuit 106 at a rate of 1/Tc, where Tc=1/(1228800 chips/second) in an IS-2000 CDMA system. For each chip, the finger circuit 134 generally selects one out of eight samples FRX to use. In each finger circuit 134 there may be two or three correlator circuits 136 specifically used for time tracking and AFC. The three correlator circuits 136 may operate on samples FRX spaced Tc/2 apart to produce the early correlation sample, the on-time correlation sample, and the late sample used for the AFC process 132 and the time tracking process 130. In the embodiment illustrated in FIG. 4, two correlator circuits 136a-136b may be implemented where the early/late pilot correlator circuit 136a may produce the early sample Ca and the delay process 140 may produce the late sample DCa by delaying the filtered early sample FCa.

The AFC process 132 generally seeks to track a carrier frequency of the received signal RF. When the frequency is locked, a pilot channel in the received signal RF may appear as a constant sample at the output of the on-time pilot correlator circuit 136b. A frequency error between the transmitter 12 and the receiver 100 generally appears as a phase rotation in the output signal of the on-time pilot correlator circuit 136b. The phase rotation may be averaged by the averaging process 160 to reduce noise. When multiple finger circuits 134 may be assigned, a weighted average among the finger circuits 134 is generally taken and then converted to an estimate of the frequency error by dividing by a "delay" used in the rotation estimate. The frequency error may be converted a fractional error in the conversion process 162 by dividing by the carrier frequency and subtracting from one. A running sum of a scaled error may be kept by the integration process 164 and then applied to the VCO circuit 118. The scaling of the fractional error may be used to adjust a time constant of the AFC process 132. For the AFC process 132, the pilot sample may be accumulated by the summation circuit 180 to 512 chips received from each correlator circuit 136 and then sampled. Two successive samples may be conjugate multiplied by the multiplier process 150 and then averaged over 48 samples by the summation process 156 and computation process 158 to produce a rotation statistic for each finger circuit 134 once every 20 milliseconds (ms). The rotation statistics may be averaged together by the averaging process 160 and converted to fractional frequency error by the conversion process 162. The scaling parameter (e.g., signal SCALE) is generally selected to result in a settling time of approximately 400 ms.

The time tracking process 130 generally uses the power of the early sample, the on-time sample and the late sample of each finger circuit 134 to produce a time tracking decision (e.g., signal TRK) for each finger circuit 134. The low pass filter 184 may be implemented as a single pole infinite impulse response (IIR) filter for ease of implementation. The time tracking decision is based on a statistic defined by equation 1 as follows:

$$ET=(P\_E-P\_L)/P\_OT \qquad \text{Eq.(1)}$$

if ET>R1 then too late, increment by +Tc/8
if ET<R1 then too early, increment by −Tc/8
else no change
where R1 may be a constant of 0.02505.

Generally, the pilot signal may be coherently accumulated over 512 chips and sampled by the power calculation averaging process 142 once every 512 chips, sampled at 2.4 kilohertz. The early power P_E, the late power P_E and the on-time power P_OT may be computed and individually averaged with a first order IIR filter (e.g., low pass filter 184) defined by equation 2 as follows:

$$Y[n]=(1-A1)*X[n]+A1*Y[n-1] \qquad \text{Eq.(2)}$$

where A1 may be a constant of 0.98.

The first order IIR filter generally results in a filter delay of approximately 10 ms. Time track decisions may be made once approximately every 80 ms.

The time track decision process 144 may apply a bias via the timing error statistic signal ET to the frequency error signal FERR calculated by the AFC process 132 based on a function of the timing error. The function of the timing error may be defined by equation 3 as follows:

$$FERR=FERR+f(ET) \qquad \text{Eq.(3)}$$

A positive ET generally indicates that a sample is late and a negative ET generally indicates that the sample is early. The timing error statistic ET may be taken from the finger circuit 134 with the strongest path, but other combinations may be possible. For example, a realization of the function f(ET) may be given by equation 4 as follows:

$$f(X) = \begin{cases} +B & \text{if } X > Rf \\ -B & \text{if } X < Rf \\ 0 & \text{otherwise} \end{cases} \qquad \text{Eq. (4)}$$

where Rf may be a constant of approximately 0.003 and the constant B may be an amount of frequency bias to be applied (assuming that the VCO frequency increases with increasing input values).

The value Rf is generally inversely proportional to the signal to noise ratio (SNR) of the timing error statistic signal ET. Smaller values of Rf may allow for a smaller timing error. The time tracking process 130 effectively slows down the reference clock signal F_REF if the timing is early and speeds up the reference clock signal F_REF when the timing is late. The constant B may be adjusted to keep the update speed of the reference clock signal F_REF approximately five times slower than a normal time tracking routine and keep an induced frequency bias to be less than approximately 10 Hz. As such, timing corrections at the Tc/8 rate level may be applied first and the time tracking process 130 compensates for the sub-sample timing offsets <Tc/16.

In one example, the present invention may be used in a CDMA2000 mobile communication system. In another example, the present invention may be used in worldwide third generation CDMA systems as specified by IS-2000 1X standards. However, the present invention may be easily implemented in other designs.

The function performed by the diagrams of FIGS. 4-6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICS, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMS, RAMS, EPROMS, EEPROMs, Flash memory, magnetic or optical cards, or any type of media suitable for storing electronic instructions.

As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A circuit comprising:
an analog to digital converter configured to generate a plurality of samples from a received signal in response to a reference signal;
a processor configured to (i) generate third data by delaying first data by one chip period and (ii) generate a timing error signal (a) related to a difference between said first data and said third data and (b) inversely related to second data, (iii) determine a designation of an ideal sample as one of a first sample of said samples and a second sample of said samples in a first condition, said first condition having a) a first timing error between a given sample of said samples and a corresponding transmitted sample and b) said first timing error being greater than one-half a sample period of said received signal, (iv) generate a tracking signal conveying said designation and (v) generate a bias that phase shifts said reference signal to minimize a second timing error between said ideal sample and said corresponding transmitted sample; and
a correlator bank configured to i) generate said first data and said second data by correlating a received pseudo-random number code with a local pseudo-random number code and ii) decimate said samples in response to said tracking signal such that said ideal sample alone is used to represent a chip of said received pseudo-random number code.

2. The circuit according to claim 1, wherein said processor is further configured to generate a frequency control signal to synchronize a reference frequency of said reference signal with a transmit frequency of said received signal.

3. The circuit according to claim 2, further comprising a reference oscillator configured to generate said reference signal controllable by said frequency control signal.

4. The circuit according to claim 2, wherein said processor is further configured to apply said bias to said frequency control signal.

5. The circuit according to claim 1, wherein processor repeatedly commands a re-designation of said ideal sample by a predetermined step while said bias is outside a fixed range.

6. The circuit according to claim 1, wherein i said processor is further configured to determine said designation of said ideal sample as a third sample of said samples in a second condition, said second condition having said first timing error being less than one-half of said sample period and ii said third sample is temporally between said first sample and said second sample.

7. The circuit according to claim 1, wherein said received signal comprises a code division multiple access signal.

8. The circuit according to claim 1, wherein said processor is further configured to generate said timing error signal based on all of said first data, said second data and said third data.

9. The circuit according to claim 1, wherein said processor is further configured to adjust said tracking signal by said sample period in response to said first timing error being outside a predetermined range.

10. The circuit according to claim 1, wherein said processor is further configured to apply said bias to a frequency control signal through said timing error signal while said first timing error is within a predetermined range.

11. The circuit according to claim 10, wherein said predetermined range comprises one-half of said sample period.

12. The circuit according to claim 1, wherein said processor is further configured to command i an increase of said ideal sample by one of said samples where said bias is above a fixed range and ii a decrease of said ideal sample by one of said samples where said bias is below said first range such that said bias moves into said fixed range.

13. A method for processing a received signal, comprising the steps of:
 (A) generating a plurality of samples from said received signal in response to a reference signal using an analog to digital converter;
 (B) generating first data and second data by correlating a received pseudo-random number code with a local pseudo-random number code;
 (C) generating third data by delaying said first data by one chip period;
 (D) generating a timing error signal (i) related to a difference between said first data and said third data and (ii) inversely related to said second data;
 (E) designating an ideal sample as one of a first sample of said samples and a second sample of said samples in a first condition using a processor, said first condition having (a) a first timing error between a given sample of said samples and a corresponding transmitted sample and (b) said first timing error being greater than one-half a sample period of said received signal;
 (F) generating a tracking signal conveying said designation;
 (G) generate a bias that phase shifts said reference signal to minimize a second timing error between said ideal sample and said corresponding transmitted sample; and
 (H) decimating said samples using a correlator bank in response to said tracking signal such that said ideal sample alone is used to represent a chip of said received pseudo-random number code.

14. The method according to claim 13, further comprising the step of:
 generating a frequency control signal to synchronize a reference frequency of said reference signal with a transmit frequency of said received signal.

15. The method according to claim 14, further comprising the step of:
 controlling said reference frequency with said frequency control signal.

16. The method according to claim 14, further comprising the step of:
 applying said bias to said frequency control signal.

17. The method according to claim 13, further comprising the step of:
 adjusting said ideal sample by a predetermined step while said bias is outside a fixed range.

18. The method according to claim 13, further comprising the step of:
 designating said ideal sample as a third sample of said samples in a second condition, said second condition having said first timing error being less than one-half of said sample period, wherein said third sample is temporally between said first sample and said second sample.

19. The method according to claim 14, wherein said received signal comprises a code division multiple access signal.

20. The method according to claim 13, further comprising the step of:
 generating said timing error signal based on all of said first data, said second data and said third data.

21. The method according to claim 13, further comprising the step of:
 adjusting said tracking signal by said sample period of said received signal in response to said first timing error being outside a predetermined range.

22. The method according to claim 13, further comprising the step of:
 applying said bias to a frequency control signal through said timing error signal while said first timing error is within a predetermined range.

23. The method according to claim 13, further comprising a computer program stored in a computer readable medium executed by a computer capable to perform the steps of claim 13.

24. The method according to claim 13, further comprising the step of:
 commanding (i) an increase of said ideal sample by one of said samples where said bias is above a fixed range and (ii) a decrease of said ideal sample by one of said samples where said bias is below said first range such that said bias moves into said fixed range.

25. A circuit comprising:
 means for generating a frequency error signal to synchronize a reference frequency with a transmit frequency of a received signal;
 means for generating first data and second data by correlating a received pseudo-random number code with a local pseudo-random number code;

means for generating third data by delaying said first data by one chip period;

means for generating a timing error signal (i) related to a difference between said first data and said third data and (ii) inversely related to said second data;

means for designating one of i) a first sample of a plurality of samples digitized from said received signal and ii) a second sample of said samples as an ideal sample in response to a first timing error between a given sample of said samples and a corresponding transmitted sample, said first timing error being greater than one-half a sample period of said received signal, said ideal sample alone representing a chip of said received pseudo-random number code; and means for applying a bias to said frequency error signal in response to a second timing error between said ideal sample and said corresponding transmitted sample to minimize said second timing error.

26. The circuit according to claim 25, wherein said means for designating is further configured to command i an increase of said ideal sample by one of said samples where said bias is above a fixed range and ii a decrease of said ideal sample by one of said samples where said bias is below said first range such that said bias moves into said fixed range.

27. A circuit comprising:

an analog to digital converter configured to generate a plurality of samples from a received signal in response to a reference signal;

a correlator bank configure to generate first data and second data by correlating a received pseudo-random number code with a local pseudo-random number code; and a processor configured to (i) generate third data by delaying said first data by one chip period and (ii) generate a timing error signal (a) related to a difference between said first data and said third data and (b) inversely related to said second data, (iii) designate one of a first sample of said samples and a second sample of said samples as an ideal sample in response to a first timing error between a given sample of said samples and a corresponding transmitted sample, said first timing error being greater than one-half a sample period of said received signal, said ideal sample alone representing a chip of said received pseudo-random number code, (iv) generate a frequency control signal to synchronize a reference frequency of said reference signal with a transmit frequency of said received signal and (v) apply a bias to said frequency control signal in response to a second timing error between said ideal sample and said corresponding transmitted sample to minimize said second timing error.

28. The circuit according to claim 27, wherein said processor comprises:

a decision block configured to generate said timing error signal carrying said bias based on all of first correlation data, second correlation data and third correlation data; and an average block configured to average said timing error signal prior to said bias being applied to said frequency control signal.

29. The circuit according to claim 27, wherein said processor is further configured to command i) an increase of said ideal sample by one of said samples where said bias is above a fixed range and ii) a decrease of said ideal sample by one of said samples where said bias is below said first range such that said bias moves into said fixed range.

30. The circuit according to claim 27, wherein i said correlator bank is further configured to decimate said samples in response to a tracking signal conveying said designation and ii said processor is further configured to generate said tracking signal.

* * * * *